United States Patent
Koide et al.

(10) Patent No.: US 11,194,206 B2
(45) Date of Patent: Dec. 7, 2021

(54) SEMICONDUCTOR SUBSTRATE AND DISPLAY DEVICE

(71) Applicant: Japan Display Inc., Tokyo (JP)

(72) Inventors: Gen Koide, Tokyo (JP); Masataka Ikeda, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 17/203,771

(22) Filed: Mar. 17, 2021

(65) Prior Publication Data
US 2021/0294170 A1 Sep. 23, 2021

(30) Foreign Application Priority Data
Mar. 18, 2020 (JP) ............................. JP2020-048059

(51) Int. Cl.
*G02F 1/1333* (2006.01)
*G02F 1/1362* (2006.01)
*H01L 27/12* (2006.01)

(52) U.S. Cl.
CPC .. *G02F 1/136286* (2013.01); *G02F 1/133345* (2013.01); *H01L 27/124* (2013.01)

(58) Field of Classification Search
CPC ................................................. G02F 1/136286
See application file for complete search history.

(56) References Cited

U.S. PATENT DOCUMENTS

2018/0364535 A1* 12/2018 Shiina ............... G02F 1/134363
2020/0379307 A1* 12/2020 Zhang ................. H01L 27/1288

FOREIGN PATENT DOCUMENTS

JP 2019-3127 A 1/2019

* cited by examiner

*Primary Examiner* — Sang V Nguyen
(74) *Attorney, Agent, or Firm* — Xsensus LLP

(57) ABSTRACT

According to one embodiment, a semiconductor substrate includes a signal line including a first area overlapping a first concave groove portion and a second area not overlapping the first concave groove portion. The signal line includes a first layer and a second layer. A first end portion of the first layer of the first area projects from a side surface of the second layer in a direction parallel to a plane of the first base. The first layer of the first area includes a first portion between the side surface of the second layer and the first end portion. The first portion is in contact with a side surface of the first concave groove portion, and the side surface of the second layer is covered with the first portion in the first concave groove portion.

11 Claims, 9 Drawing Sheets

SEMICONDUCTOR SUBSTRATE AND DISPLAY DEVICE

CROSS-REFERENCE TO RELATED APPLICATIONS

This application is based upon and claims the benefit of priority from Japanese Patent Application No. 2020-048059, filed Mar. 18, 2020, the entire contents of which are incorporated herein by reference.

FIELD

Embodiments described herein relate generally to a semiconductor substrate and a display device.

As a display device, there are, for example, a liquid crystal display device and an electrophoretic display device which will be described in the present embodiment, an OLED display device, a micro-LED display device, and the like.

As a semiconductor substrate, there are, for example, a substrate comprising a semiconductor of the above-described display device, a substrate using a semiconductor such as an optical sensor substrate, and the like.

BACKGROUND

Regarding a semiconductor substrate and a display device, an active matrix type comprising a thin-film transistor is known.

DETAILED DESCRIPTION

Figure 1A:
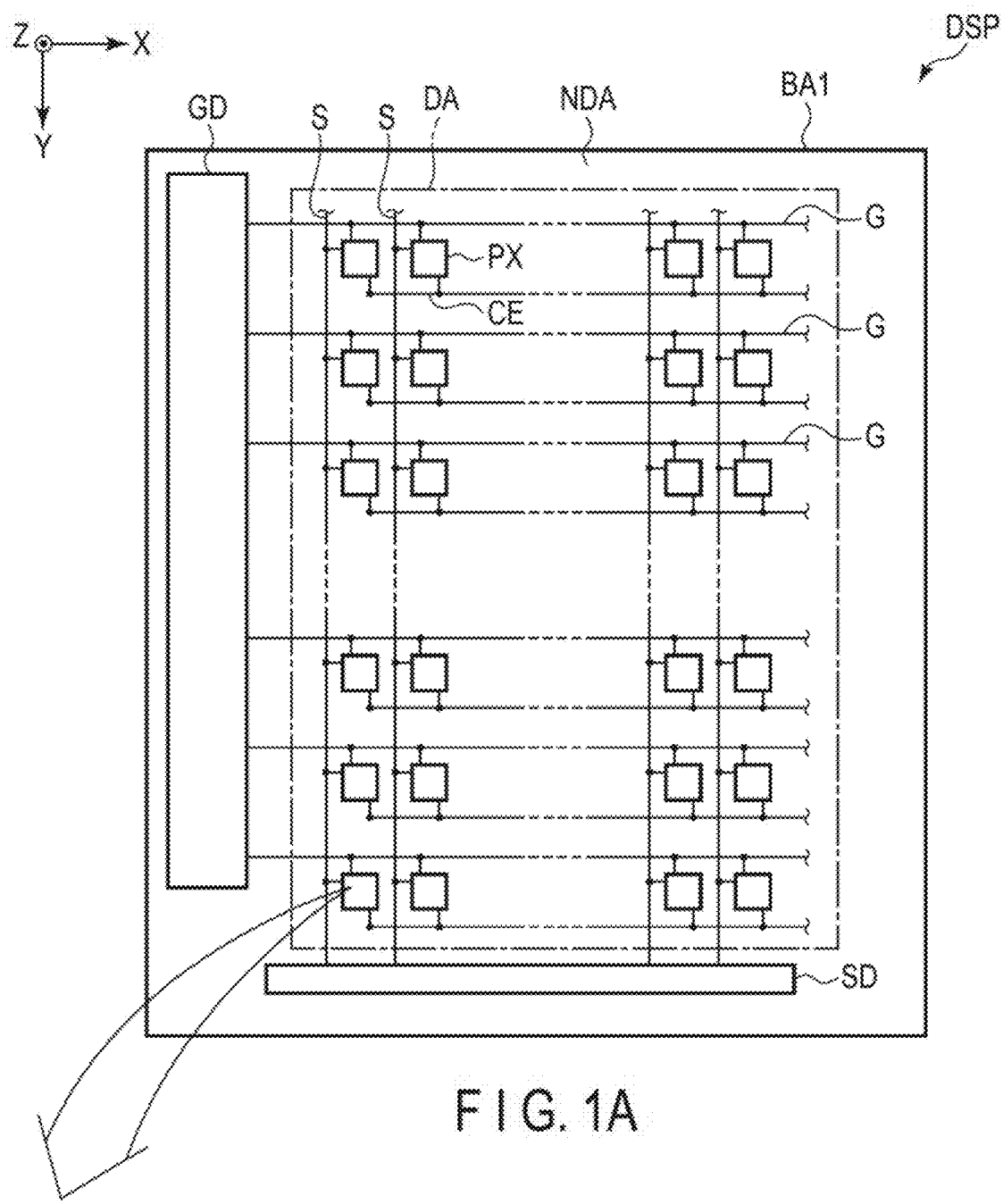
FIG. 1A is a circuit diagram showing a display device DSP of the present embodiment.

In general, according to one embodiment, there is provided a semiconductor substrate comprising a first base, a first insulating layer disposed over the first base, a scanning line disposed over the first insulating layer, a second insulating layer disposed over the first insulating layer and the scanning line, a first concave groove portion disposed in at least the second insulating layer, and a signal line comprising a first area overlapping the first concave groove portion and a second area not overlapping the first concave groove portion. The second area of the signal line is disposed on the second insulating layer. The signal line is a layer stack comprising a first layer and a second layer stacked on the first layer. A first end portion of the first layer of the first area projects from a side surface of the second layer in a direction parallel to a plane of the first base. The first layer of the first area comprises a first portion between the side surface of the second layer and the first end portion. The first portion is in contact with a side surface of the first concave groove portion, and the side surface of the second layer is covered with the first portion in the first concave groove portion.

According to another embodiment, there is provided a semiconductor substrate comprising a first base, a first insulating layer disposed over the first base, a scanning line disposed over the first insulating layer, a second insulating layer disposed over the first insulating layer and the scanning line, a first concave groove portion disposed in at least the second insulating layer, a signal line comprising a first area overlapping the first concave groove portion and a second area not overlapping the first concave groove portion, and an organic insulating layer covering the signal line. The second area of the signal line is disposed on the second insulating layer. The signal line is a layer stack comprising a second layer and a third layer stacked on the second layer. The third layer of the first area comprises a second end portion projecting from a side surface of the second layer in a direction parallel to a plane of the first base. The third layer of the first area comprises a second portion between the side surface of the second layer and the second end portion. The organic insulating layer fills between the side surface of the second layer of the first area and a side surface of the first concave groove portion and between the first base and the second portion.

According to yet another embodiment, there is provided a semiconductor substrate comprising a first base, a first insulating layer disposed over the first base, a scanning line disposed over the first insulating layer, a second insulating layer disposed over the first insulating layer and the scanning line, a first concave groove portion disposed in at least the second insulating layer, and a signal line comprising a first area overlapping the first concave groove portion and a second area not overlapping the first concave groove portion. The second area of the signal line is disposed on the second insulating layer. The signal line is a layer stack comprising a first layer and a second layer stacked on the first layer. A first end portion of the first layer of the first area projects from a side surface of the second layer in a direction parallel to a plane of the first base. The first layer of the first area comprises a first portion between the side surface of the second layer and the first end portion, and the first end portion is located more inward than a side surface of the first concave groove portion.

According to the present embodiment, a semiconductor substrate and a display device which can improve display quality can be provided.

Embodiments of the present invention will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, elements similar to those described in connection with preceding drawings are denoted by the same reference numbers, and detailed description of them is omitted unless necessary.

A semiconductor substrate and a display device according to one embodiment will be described in detail with reference to the accompanying drawings.

In the present embodiment, a first direction X, a second direction Y and a third direction Z are orthogonal to one another. However, they may cross one another at an angle other than 90 degrees. A direction toward the point of an arrow indicating the third direction Z is defined as upward or above, and a direction opposite to the direction toward the point of the arrow indicating the third direction Z is defined as downward or below.

In addition, an observation position from which the display device DSP is observed is assumed to be located on a side on which the point of the arrow indicating the third direction Z is located, and viewing from this observation position toward an XY-plane defined by the first direction X and the second direction Y is referred to as planar view. Viewing a cross section of the display device DSP in an XZ-plane defined by the first direction X and the third direction Z or a YZ-plane defined by the second direction Y and the third direction Z is referred to as cross-sectional view. Furthermore, the XY-plane is a plane parallel to the plane of a first base BA1 which will be described later, and the first direction X is a direction parallel to the plane of the first base BA1, and the second direction Y is also a direction parallel to the plane of the first base BA1.

Furthermore, when described as the second member above the first member and the second member below the first member, the second member may be in contact with the first member or apart from the first member. In the latter case, the third member may be interposed between the first member and the second member. On the other hand, when described as the second member on the first member and the second member under the first member, the second member is in contact with the first member.

Embodiment 1

Figure 1B:
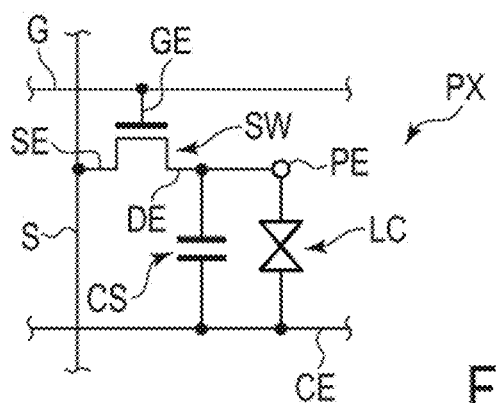
FIG. 1B is a circuit diagram showing the display device DSP of the present embodiment.

FIGS. 1A and 1B are circuit diagrams showing a display device DSP of the present embodiment. FIG. 1A is an overall circuit diagram of the display device DSP of the present embodiment, and FIG. 1B is a partial enlarged view of FIG. 1A. The display device DSP comprises a display area DA which displays an image, and a non-display area NDA other than the display area DA. In the present embodiment, the non-display area NDA is formed in a frame shape.

As shown in FIGS. 1A and 1B, the display device DSP comprises a first base BA1, a plurality of pixels PX arrayed in a matrix above the first base BA1 in the display area DA, a plurality of scanning lines G, and a plurality of signal lines S. In addition, the display device DSP comprises a second base BA2 (not shown) opposed to the first base BA1 in the third direction Z, and a display function layer held between the first base BA1 and the second base BA2, for example, a liquid crystal layer LC.

The scanning lines G arranged in the second direction Y are connected to the scanning line driving circuit GD. The signal lines S arranged in the first direction X are connected to the signal line driving circuit SD. The scanning lines G and the signal lines S do not necessarily extend straight but may be partially bent. For example, the signal lines S are still assumed to extend in the second direction Y even if they are partially bent.

Each pixel PX comprises a switching element SW, a pixel electrode PE, a common electrode CE, a liquid crystal layer LC, and the like. The switching element SW is composed of a thin-film transistor (TFT) and is electrically connected to the scanning line G and the signal line S. The scanning line G is electrically connected to a gate electrode GE of the switching element SW in each of the pixels PX arranged in the first direction X. The signal line S is electrically connected to a source electrode SE of the switching element SW in each of the pixels PX arranged in the second direction Y. The pixel electrode PE is electrically connected to a drain electrode DE of the switching element SW. A storage capacitance CS is formed, for example, between an electrode of the same potential as the common electrode CE and an electrode of the same potential as the pixel electrode PE.

Each pixel electrode PE is opposed to the common electrode CE and drives the liquid crystal layer LC by an electric field produced between the pixel electrode PE and the common electrode CE. The liquid crystal layer LC modulates illumination light from an illumination device (not shown) disposed on the lower side of the display device DSP. Accordingly, the display device DSP performs image display.

The display device DSP shown in FIGS. 1A and 1B is a lateral electric field type liquid crystal display device. However, it is not limited to this type but may be a longitudinal electric field type liquid crystal display device. In this case, the common electrode CE is disposed in the second base opposed in the third direction Z to the first base BA1. In the longitudinal electric field type display device, the liquid crystal layer LC is driven by a so-called longitudinal electric field produced between the pixel electrode PE and the common electrode CE.

Note that the present embodiment is not limited to a liquid crystal display device but can be referred to for another display device. An example of another display device is, for example, an electrophoretic display device.

Figure 2:
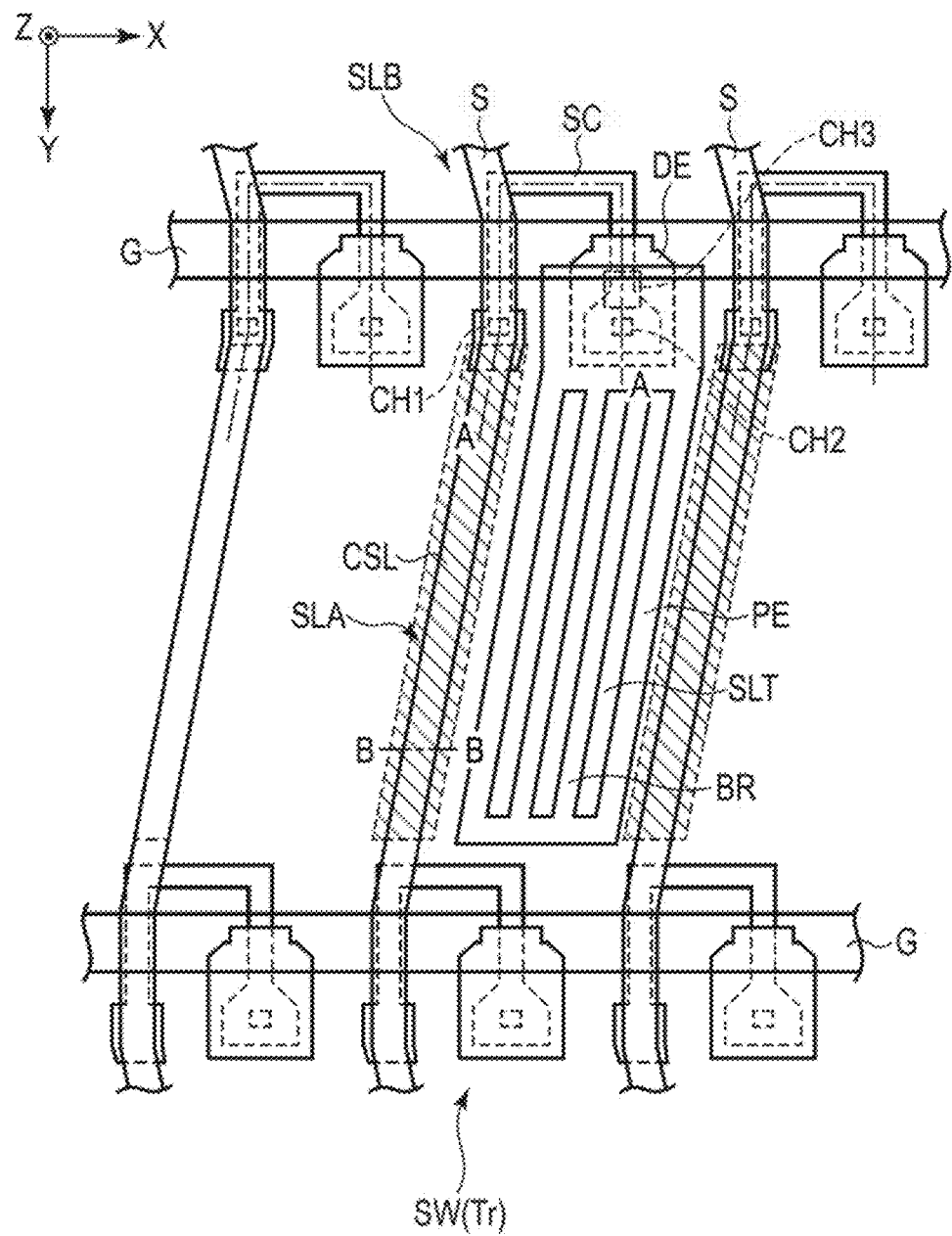
FIG. 2 is a plan view schematically showing the configuration of a pixel PX.

FIG. 2 is a plan view schematically showing the configuration of the pixel PX. Note that FIG. 2 shows the configuration of one pixel PX. In addition, in order to make the drawing easy to see, the common electrode CE, and in some pixels, the pixel electrode PE are omitted in FIG. 2.

As shown in FIG. 2, a thin-film transistor which is the switching element SW is disposed close to the intersection of the scanning line G and the signal line S. The switching element SW comprises the scanning line G (gate electrode), a semiconductor layer SC, the signal line S (source electrode), the drain electrode DE, and the pixel electrode PE.

The semiconductor layer SC of the thin-film transistor (hereinafter referred to as a transistor Tr) is electrically connected to the signal line S via a contact hole CH1. The semiconductor layer SC is electrically connected to the drain electrode DE via a contact hole CH2.

The pixel electrode PE comprises a plurality of band electrodes BR and a plurality of slits SLT. The pixel electrode PE is electrically connected to the drain electrode DE via a contact hole CH3.

The signal line S shown in FIG. 2 comprises a first area SLA overlapping a concave groove portion CSL, and a second area SLB not overlapping the concave groove portion CSL. In addition, as will be described later, the signal line S is formed of a layer stack of a first layer SL1, a second layer SL2 and a third layer SL3. That is, the second layer SL2 is stacked on the first layer SL1, and the third layer SL3 is stacked on the second layer SL2. Note that the signal line S may be a layer stack of at least the first layer SL1 and the second layer SL2. Alternatively, the signal line S may be a layer stack of four or more conductive layers. The concave groove portion CSL, the first area SLA, the second area SLB, the first layer SL1, the second layer SL2 and the third layer SL3 will be described in detail later.

Figure 3:
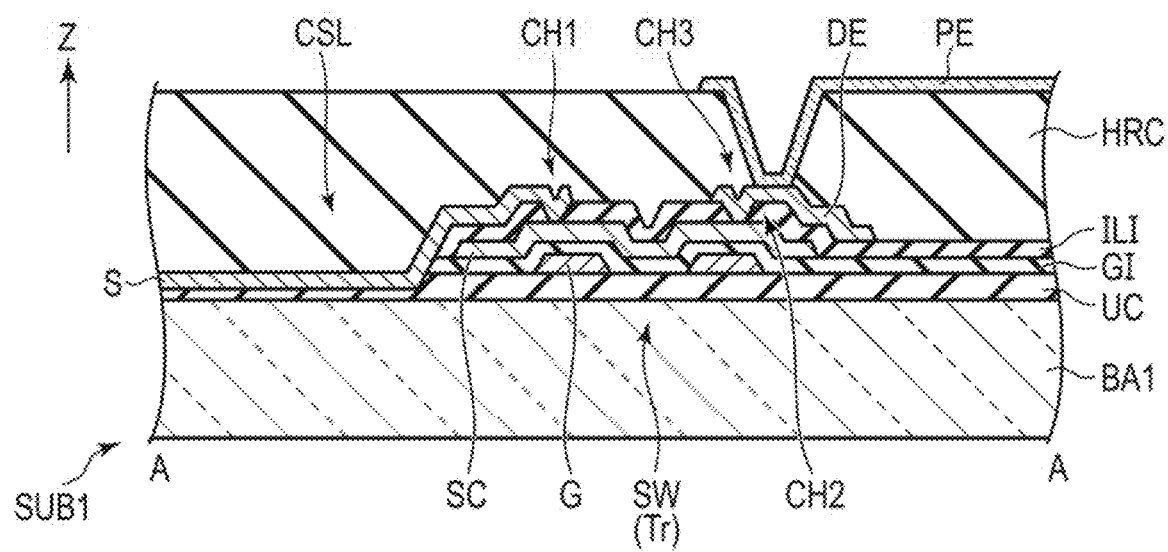
FIG. 3 is a cross-sectional view of a first substrate SUB1 along line A-A of FIG. 2.

FIG. 3 is a cross-sectional view of the first substrate SUB1 along line A-A of FIG. 2. As shown in FIG. 3, the scanning line G, the semiconductor layer SC and the signal line S are disposed in this order on the first base BA1. More specifically, an undercoat layer UC is disposed covering the first base BA1. The scanning line G is disposed on the undercoat layer UC. On the scanning line G and the undercoat layer UC, a gate insulating layer GI is disposed covering the scanning line G.

The semiconductor layer SC is disposed on the scanning line G while sandwiching the gate insulating layer GL. The signal line S and the drain electrode DE are disposed overlapping a source area and a drain area of the semiconductor layer SC, respectively. An interlayer insulating layer ILI is disposed covering the semiconductor layer SC, the signal line S and the drain electrode DE. The signal line S is electrically connected to the semiconductor layer SC of the transistor Tr via the contact hole CH1 disposed in the interlayer insulating layer ILI. The drain electrode DE is electrically connected to the semiconductor layer SC of the transistor Tr via the contact hole CH2 disposed in the interlayer insulating layer ILI.

The transistor Tr of the present embodiment is a so-called bottom-gate transistor but is not limited to this. The transistor Tr may be a top-gate transistor. The top-gate transistor comprises the semiconductor layer SC on the undercoat layer UC, the scanning line G (gate electrode) on the semiconductor layer SC via the gate insulating layer GI, the interlayer insulating layer ILI on the scanning line G and the gate insulating layer GI, and the signal line S (source electrode) and the drain electrode DE electrically connected to the semiconductor layer SC and disposed on the interlayer insulating layer ILI.

A planarization insulating layer HRC is disposed covering the interlayer insulating layer ILI. The pixel electrode PE is disposed on the planarization insulating layer HRC. The pixel electrode PE is electrically connected to the drain electrode DE via the contact hole CH3 disposed in the planarization insulating layer HRC.

The undercoat layer UC, the gate insulating layer GI and the interlayer insulating layer ILI are inorganic insulating layers using oxide such as silicon oxide ($SiO_2$) or nitride such as silicon nitride (SiN). The undercoat layer UC, the gate insulating layer GI and the interlayer insulating layer ILI are each not limited to a single layer but may be composed of a plurality of insulating layers stacked on top of one another. For example, a stack film of silicon oxide and silicon nitride may be used as the undercoat layer UC, a silicon oxide film may be used as the gate insulating layer GI, and a stack film of silicon oxide and silicon nitride may be used as the interlayer insulating layer ILI.

In addition, the planarization insulating layer HRC is an organic insulating layer, and more specifically, an organic resin material such as acrylic or polyimide may be used.

In the present specification, the undercoat layer UC, the gate insulating layer GI and the interlayer insulating layer ILI are also referred to simply as insulating layers or inorganic insulating layers, and the planarization insulating layer HRC is also referred to simply as an insulating layer or an organic insulating layer. Furthermore, they may be described as insulating layers with numerals such as the first insulating layer, the second insulating layer, the third insulating layer and the fourth insulating layer, and may be differentiated from one another as different insulating layers.

The scanning line G is formed of a metal material such as aluminum (Al), titanium (Ti), silver (Ag), molybdenum (Mo), tungsten (W), copper (Cu) or chromium (Cr), an alloy of these metal materials combined together, or the like. The scanning line G may have a single-layer structure or multilayer structure of these metal materials and alloy.

The material for the semiconductor layer SC is, for example, low-temperature polysilicon or oxide semiconductor.

The pixel electrode PE and the common electrode CE are formed of a transparent conductive material such as indium tin oxide (ITO) or indium zinc oxide (IZO).

The signal line S and the drain electrode DE are formed of three layers of conductive materials, that is, the first layer SL1 to the third layer SL3 as described above. The details will be described below.

Figure 4:
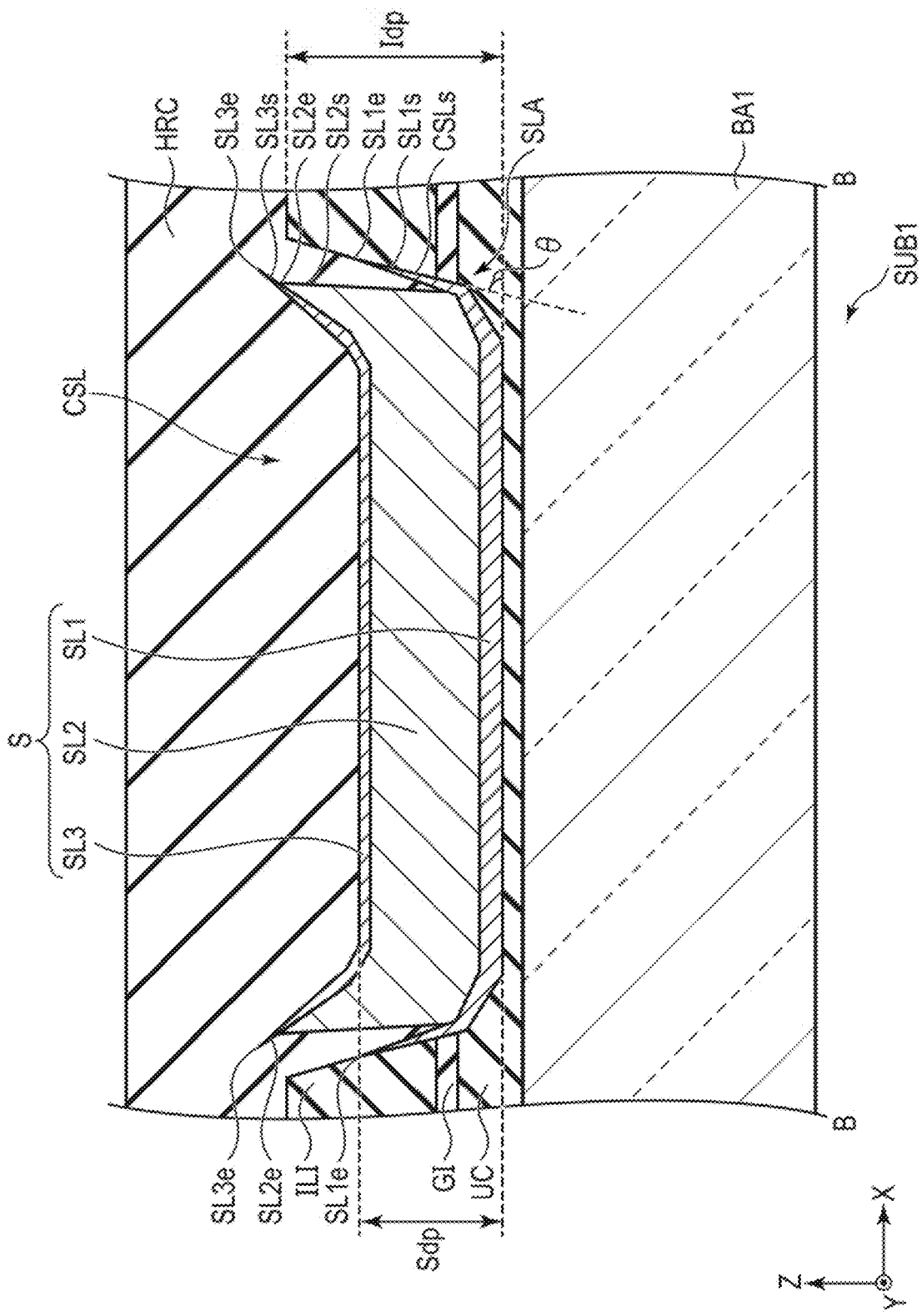
FIG. 4 is an enlarged cross-sectional view of the first substrate SUB1 along line B-B of FIG. 2.

FIG. 4 is an enlarged cross-sectional view of the first substrate SUB1 along line B-B of FIG. 2.

The concave groove portion CSL is formed in the undercoat layer UC, the gate insulating layer GI and the interlayer insulating layer ILI. The first area SLA of the signal line S shown in FIG. 2 is disposed in the concave groove portion CSL, and the second area SLB of the signal line S is disposed on the interlayer insulating layer ILI. In FIG. 4, the concave groove portion CSL is also formed in the undercoat layer UC. However, it is not limited to this. The concave groove portion CSL only has to be formed in at least the gate insulating layer GI and the interlayer insulating layer ILI, and the concave groove portion CSL may not reach the undercoat layer UC.

The concave groove portion CSL is formed by photolithographing and etching the undercoat layer UC, the gate insulating layer GI and the interlayer insulating layer ILI. After the concave groove portion CSL is formed, conductive layers which will be the first layer SL1, the second layer SL2 and the third layer SL3 of the signal line S are deposited in this order in the third direction Z while covering the concave groove portion CSL and the interlayer insulating layer ILI. Then, the deposited layer stack is photolithographed and etched. Accordingly, the first layer SL1, the second layer SL2 and the third layer SL3 of the signal line S are formed. Note that, also when the signal line S is a layer stack of the first layer SL1 and the second layer SL2 or a layer stack of four or more layers, the respective layers are formed by stacking conductive layers which are the materials of them and etching the layer stack.

In the present embodiment, the first layer SL1 and the third layer SL3 are formed of the same material, and the second layer SL2 is formed of a material having a reflectance different from that of the first layer SL1 and the third layer SL3. More specifically, the first layer SL1 and the third layer SL3 are formed of titanium, and the second layer SL2 is formed of aluminum. As an example, aluminum has a reflectance of 95%, and titanium has a reflectance of 50%.

As described above, aluminum of the second layer SL2 has a higher reflectance than titanium of the first layer SL1 and the third layer SL3. Therefore, the illumination light from the illumination device is reflected off the side surface of the second layer SL2, and the reflected light is emitted upward toward a display surface. Accordingly, the black luminance of a display image is reduced, and a contrast may be degraded.

In addition, when the illumination light is reflected at the second layer SL2, depolarization which is a change of a polarization state may occur. When depolarization occurs, the side surface of the signal line S (the second layer SL2) which is normally invisible during image display becomes visible as a linear non-uniformity. Accordingly, the quality of a display image may be degraded.

In the present embodiment, the reflection at the second layer SL2 of the signal liner S is suppressed by disposing the signal line S in the concave groove portion CSL disposed in the gate insulating layer GI and the interlayer insulating layer ILI.

As shown in FIG. 4, a first portion SL1s of the first layer SL1 is disposed along a side surface CSLs of the concave groove portion CSL. On the other hand, a side surface SL2s of the second layer SL2 is formed apart from the side surface CSLs of the concave groove portion CSL. In other words, the side surface SL2s of the second layer SL2 is farther from the side surface CSLs of the concave groove portion CSL than the first portion SL1s of the first layer SL1.

This is because the etching rate of titanium of the first layer SL1 (and the third layer SL3) is lower than that of aluminum of the second layer SL2. That is, aluminum is etched faster than titanium, and the second layer SL2 is hollowed more than the first layer SL1. Accordingly, the side surface SL2s of the second layer SL2 is formed apart from the side surface CSLs of the concave groove portion CSL.

The first portion SL1s of the first layer SL1 projecting from the side surface SL2s of the second layer SL2 is formed along the side surface CSLs of the concave groove portion CSL, and is in contact with the side surface CSLs of the concave groove portion CSL. On the other hand, the side surface SL2s of the second layer SL2 is not in contact with but apart from the side surface CSLs of the concave groove portion CSL as described above. It can be said that the side surface SL2s of the second layer SL2 is covered with the first portion SL1s which is the surface of the first layer SL1 formed along the side surface CSLs of the concave groove portion CSL. Accordingly, even when the light emitted from below enters the signal line S, the emitted light is reflected at not the second layer SL2 but the first layer SL1 having a lower reflectance. Therefore, the reduction of the black luminance of a display image is suppressed.

In addition, since the first layer SL1 having low reflectance is disposed on the side surface CSLs of the concave groove portion CSL, depolarization is suppressed, and the generation of a linear non-uniformity can be prevented.

Furthermore, the third layer SL3 is formed of titanium similarly to the first layer SL1. As described above, the etching rate of titanium is lower than that of aluminum of the second layer SL2. Due to the difference in etching rate, a second portion SL3s of the third layer SL3 is closer to the side surface CSLs of the concave groove portion CSL than the side surface SL2s of the second layer SL2. In other words, the side surface SL2s of the second layer SL2 is farther from the second portion SL3s of the third layer SL3.

However, the second portion SL3s of the third layer SL3 is not in contact with the side surface CSLs of the concave groove portion CSL but is apart from the side surface CSLs of the concave groove portion CSL. The second portion SL3s of the third layer SL3 and the first portion SL1s of the first layer SL1 are not parallel in cross-sectional view but extend in directions crossing each other. This is because, since the second layer SL2 which has a higher etching rate is etched faster than the third layer SL3 which is the upper layer, the shape of the third layer SL3 is deformed.

As a result of the deformation of the second portion SL3s of the third layer SL3 described above, an end portion SL1e of the first portion SL1s of the first layer SL1 and an end portion SL3e of the second portion SL3s of the third layer SL3 are substantially aligned with each other in the third direction Z. An end portion SL2e of the side surface SL2s of the second layer SL2 is located between the end portion SL1e and the end portion SL3e. Accordingly, even when the first layer SL1, the second layer SL2 and the third layer SL3 of the signal line S are not located in the concave groove portion CSL due to a manufacturing error, since the side surface SL2s is held by the first portion SL1s and the second portion SL3s, unnecessary reflection can be prevented.

In the present embodiment, as the material for the first layer SL1 and the third layer SL3 and the material for the second layer SL2, titanium and aluminum are described. However, they are not limited to this. The material for the first layer SL1 and the third layer SL3 and the material for the second layer SL2 can be any materials as long as the reflectance of the first layer and the third layer is lower than that of the second layer and the etching rate of the first layer and the third layer is lower than that of the second layer. Among the materials described as an example of the material for the scanning line G, those which satisfy the above-described conditions of reflectance and etching rate can be used as the materials for the first layer SL1 to the third layer SL3 of the signal line S. More specifically, molybdenum and aluminum may be used as the material for the first layer SL1 and the third layer SL3 and the material for the second layer SL2.

In addition, the end portion SL1e the first layer SL1 is the first end portion SL1e located at a position projecting from the side surface SL2s of the second layer SL2 or the end portion SL2e of the second layer SL2 in a direction parallel to the plane of the first base BA1 (in the first direction X in FIG. 4). The first portion SL1s of the first layer is the portion SL1s located between the side surface SL2s or the end portion SL2e of the second layer SL2 and the end portion SL1e of the first layer SL1.

Furthermore, the end portion SL3e of the third layer SL3 is the second end portion SL3e located at a position projecting from the side surface SL2s or the end portion SL2e of the second layer SL2 in a direction parallel to the plane of the first base BA1 (in the first direction X in FIG. 4). The second portion SL3s of the third layer SL3 is the portion SL3s located between the side surface SL2s or the end portion SL2e of the second layer SL2 and the end portion SL3e of the third layer SL3.

In the concave groove portion CSL of FIG. 4, an angle θ is an angle between the side surface of the interlayer insulating layer ILI which mainly defines the side surface CSLs and a plane in which the undercoat layer UC and the first layer SL1 contact each other. The angle θ is greater than or equal to 45 degrees but less than or equal to 80 degrees, and should preferably be greater than or equal to 55 degrees but less than or equal to 75 degrees.

In addition, in the concave groove portion CSL of FIG. 4, a depth Idp is the depth of the concave groove portion CSL, and the depth Idp is, for example, from 0.6 to 0.8 μm.

Furthermore, in the concave groove portion CSL of FIG. 4, a film thickness Sdp is the film thickness of the signal line S from the first layer SL1 to the third layer SL3, and is, for example, 0.70 μm. Furthermore, the signal line S is not limited to the layer stack structure of three layers described above but may have a two-layer stack structure of the first layer SL1 and the second layer SL2 or a two-layer stack structure of the second layer SL2 and the third layer SL3, or may be a four-layer stack structure including another layer in addition to the three-layer stack structure.

As shown in FIG. 4, a part inside the concave groove portion CSL in which the first layer SL1, the second layer SL2 and the third layer SL3 are not formed is filled with the planarization insulating layer HRC. The planarization insulating layer HRC fills on the first portion SL1s of the first layer SL1, the second portion SL3s of the third layer SL3, the side surface SL2s of the second layer SL2 and the side surface CSLs of the concave groove portion CSL. According to this structure, a projection and a depression are formed with respect to the inner surface of the concave groove portion CSL, and an anchor effect is produced. Therefore, the peeling of the planarization insulating layer HRC from the interlayer insulating layer ILI or the signal line S can be suppressed.

According to the present embodiment, a display device which improves a contrast by suppressing the reduction of the black luminance of a display image can be obtained. In addition, according to the present embodiment, a display device which improves a display image quality by suppressing the generation of a linear non-uniformity can be obtained.

Configuration Example 1

Figure 5:
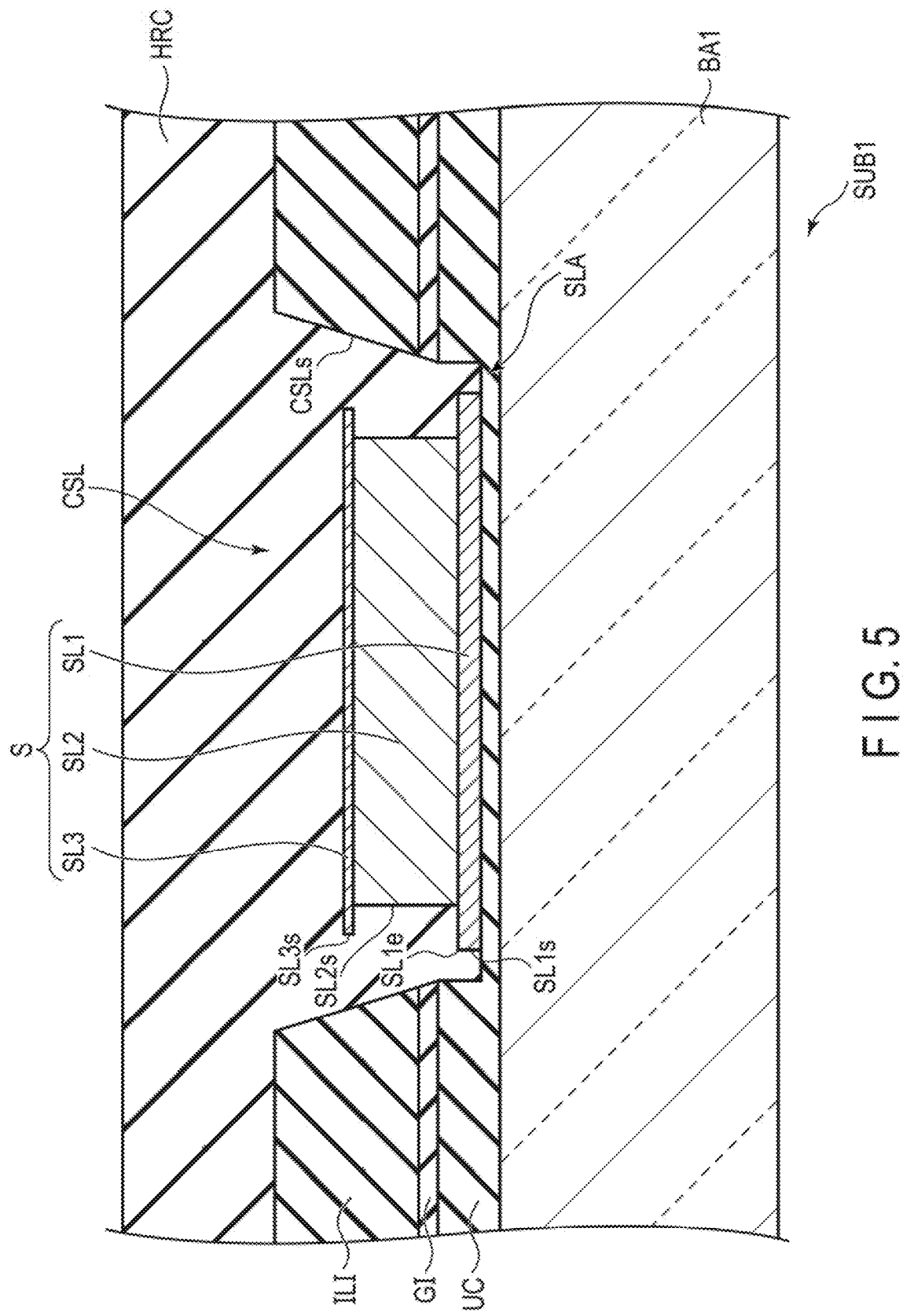
FIG. 5 is a cross-sectional view showing another configuration example of a semiconductor substrate of an embodiment 1.

FIG. 5 is a cross-sectional view showing another configuration example of the semiconductor substrate of the embodiment 1. A configuration example 1 shown in FIG. 5 is different from the configuration example shown in FIG. 4 in that the first area SLA of the signal line S is located more inward than the side surface CSLs of the concave groove portion CSL. In FIG. 5, the description of the same parts as FIG. 4 will be omitted.

More specifically, the first end portion SL1e of the first layer SL1 of the signal line S is not in contact with the side surface CSLs of the concave groove portion CSL but is located on the inner side of the side surface CSLs. In other words, the first end portion SL1e of the first layer SL1 of the signal line S is apart from the side surface CSLs of the concave groove portion CSL. That is, the width of the concave groove portion CSL in the first direction X is greater than the width of the signal line S. In FIG. 5, the planarization insulating layer HRC fills between the first end portion SL1e and the side surface CSLs.

Also in the present configuration example, effects similar those obtained in the present embodiment can be obtained.

Embodiment 2

Figure 6A:
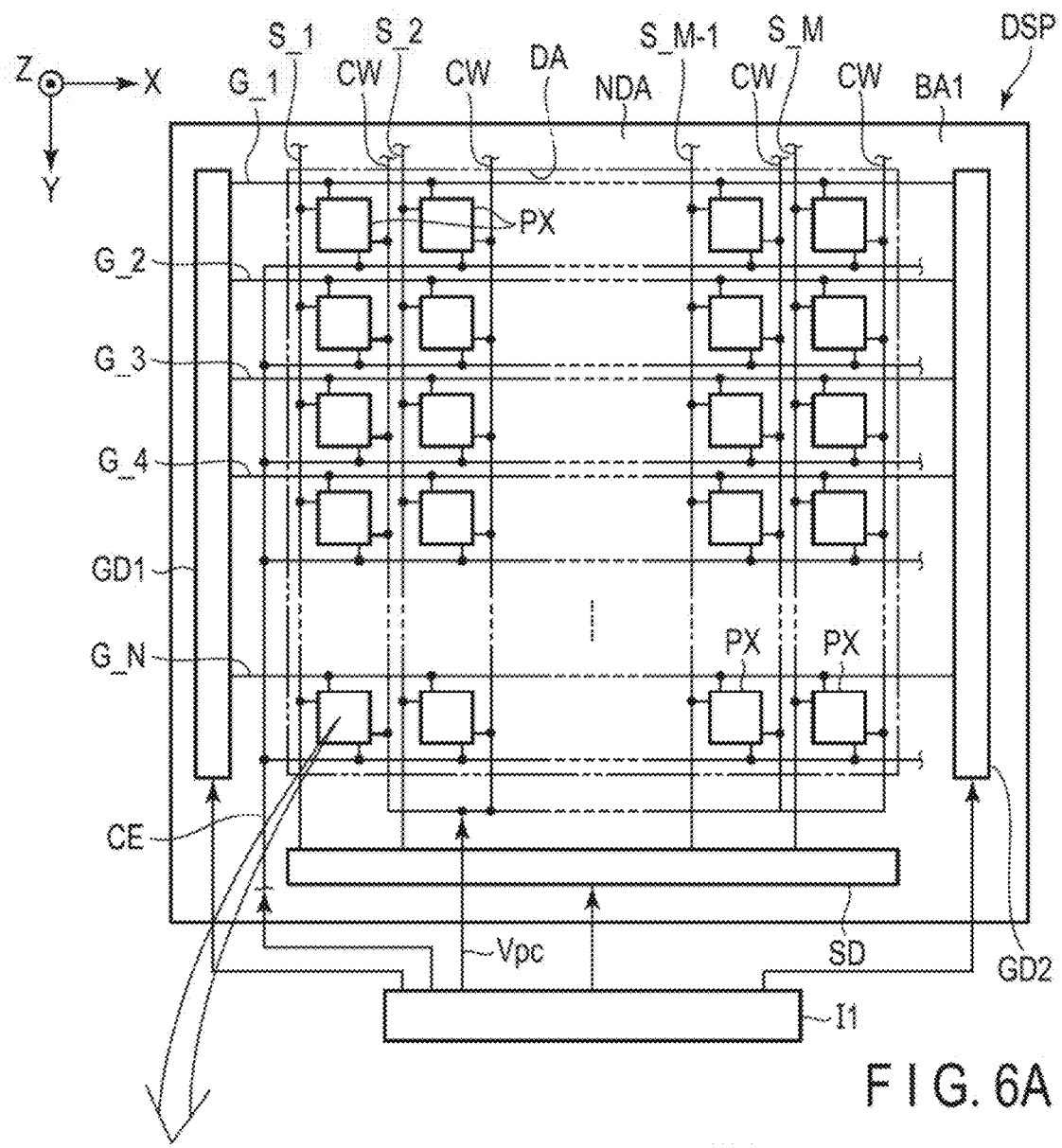
FIG. 6A is a circuit diagram of the display device in the present embodiment.
Figure 6B:
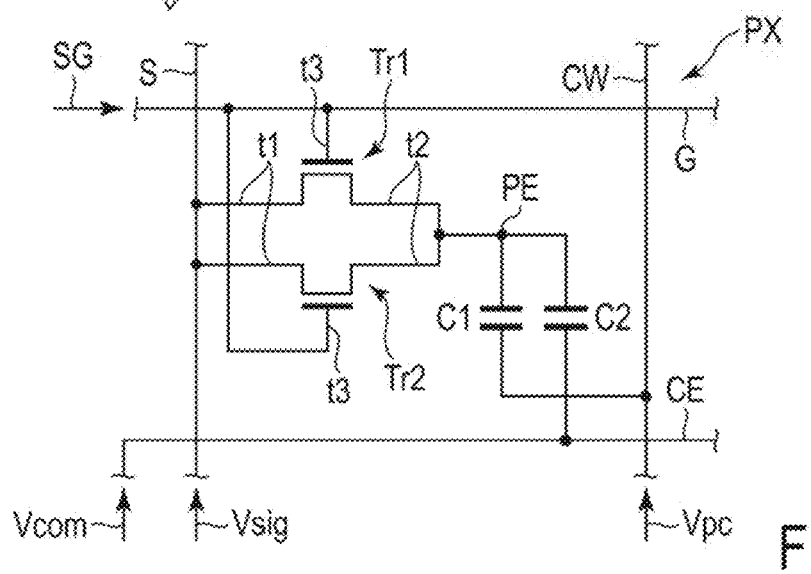
FIG. 6B is a circuit diagram of the display device in the present embodiment.

FIGS. 6A and 6B are circuit diagrams showing the display device of the present embodiment. The present embodiment is different from the embodiment 1 in that the display device is an electrophoretic device, and a part of the scanning line is replaced with a signal line layer. FIG. 6A is an overall circuit diagram of the display device DSP of the present embodiment, and FIG. 6B is a partial enlarged view of FIG. 6A.

As shown in FIGS. 6A and 6B, the display device DSP comprises the first base BA1, the pixels PX arrayed in a matrix above the first base BA1 in the display area DA, the scanning lines G, the signal lines S, and a plurality of capacitance lines CW.

In the present embodiment, the number of scanning lines G is assumed to be N, and the scanning lines G are referred to as scanning lines G_1 to G_N. However, the scanning lines are referred to simply as the scanning lines G when they do not have to be differentiated from one another. In addition, the number of signal lines S is assumed to be M, and the signal lines S are referred to as the signal lines S_1 to S_M. However, the signal lines are referred to simply as the signal lines S when they do not have to be differentiated from one another. That is, the display device DSP comprises N rows by M columns of pixels PX.

The display device DSP comprises scanning line driving circuits GD1 and GD2 and the signal line driving circuit SD. The scanning line driving circuits GD1 and GD2 are configured to drive scanning lines which will be described later, and the scanning line driving circuits GD1 and GD2 are disposed in the non-display area NDA. The signal line driving circuit SD is configured to drive signal lines which will be described later, and is disposed in the non-display area NDA.

The scanning lines G are connected to the scanning line driving circuits GD, extend in the first direction X, and are arranged in the second direction Y. The scanning lines G are electrically connected to the pixels PX arranged in the first direction X. The signal lines S are connected to the signal line driving circuit SD, extend in the second direction Y, and are arranged in the first direction X. The signal lines S are electrically connected to the pixels PX arranged in the second direction Y. The capacitance lines CW extend in the first direction X or the second direction Y. In the present embodiment, the capacitance lines CW extend in the second direction Y and are electrically connected to the pixels PX arranged in the second direction Y. The capacitance lines CW are bundled in the non-display area NDA and are connected to the IC chip I1.

The scanning line driving circuits GD are configured to supply a control signal SG to the scanning lines G and drive the scanning lines G. The signal line driving circuit SD is configured to supply an image signal (for example, a video signal) Vsig to the signal lines S and drive the signal lines S. The IC chip I1 supplies a constant voltage Vpc to the capacitance lines CW, and the capacitance lines CW are fixed to a constant potential. In addition, the IC chip I1 supplies a common voltage Vcom to the common electrode CE, and the common electrode CE is fixed to a constant potential (common potential). In the present embodiment, the common electrode CE is shared among all the pixels PX and is therefore referred to as a common electrode. In the present embodiment, the capacitance lines CW are set to the same potential as the common electrode CE but may be set to a potential different from that of the common electrode CE. The scanning line driving circuits GD, the signal line driving circuit SD and the IC chip I1 constitute a driving unit for driving the pixels PX.

Each pixel PX comprises a first transistor Tr1, a second transistor Tr2, a first capacitance C1 and a second capacitance C2. The first transistor Tr1 and the second transistor Tr2 are composed of the same conductive type, for example, an N-channel thin-film transistor (TFT). A semiconductor layer of each of the first transistor Tr1 and the second transistor Tr2 is formed of oxide semiconductor. The semiconductor layer may use semiconductor other than oxide semiconductor such as polycrystalline silicon such as low-temperature polycrystalline silicon or amorphous silicon. In addition, each of the first transistor Tr1 and the second transistor Tr2 may be composed of a P-channel TFT. In the following description, the transistor Tr using oxide semiconductor is described.

Each of the first transistor Tr1 and the second transistor Tr2 comprises a first terminal t1, a second terminal t2 and a control terminal t3. In the present embodiment, the control terminal t3 functions as a gate electrode, one of the first terminal t1 and the second terminal t2 functions as a source electrode, and the other of the first terminal t1 and the second terminal t2 functions as a drain electrode. The first transistor Tr1 and the second transistor Tr2 are electrically connected in parallel between the signal line S and the pixel electrode PE.

In each of the first transistor Tr1 and the second transistor Tr2, the first terminal t1 is connected to the signal line S, the second terminal t2 is connected to the pixel electrode PE, and the control terminal t3 is connected to the scanning line G. Accordingly, each of the first transistor Tr1 and the second transistor Tr2 is switched to a conductive state or a non-conductive state by the control signal SG supplied to the scanning line G. The image signal Vsig is applied to the pixel electrode PE via the signal line S and the first transistor Tr1 and the second transistor Tr2 in the conductive state.

The first capacitance C1 and the second capacitance C2 are capacitors. The first capacitance C1 is connected between the pixel electrode PE and the capacitance line CW. The second capacitance C2 is connected between the pixel electrode PE and the common electrode CE.

Figure 7:
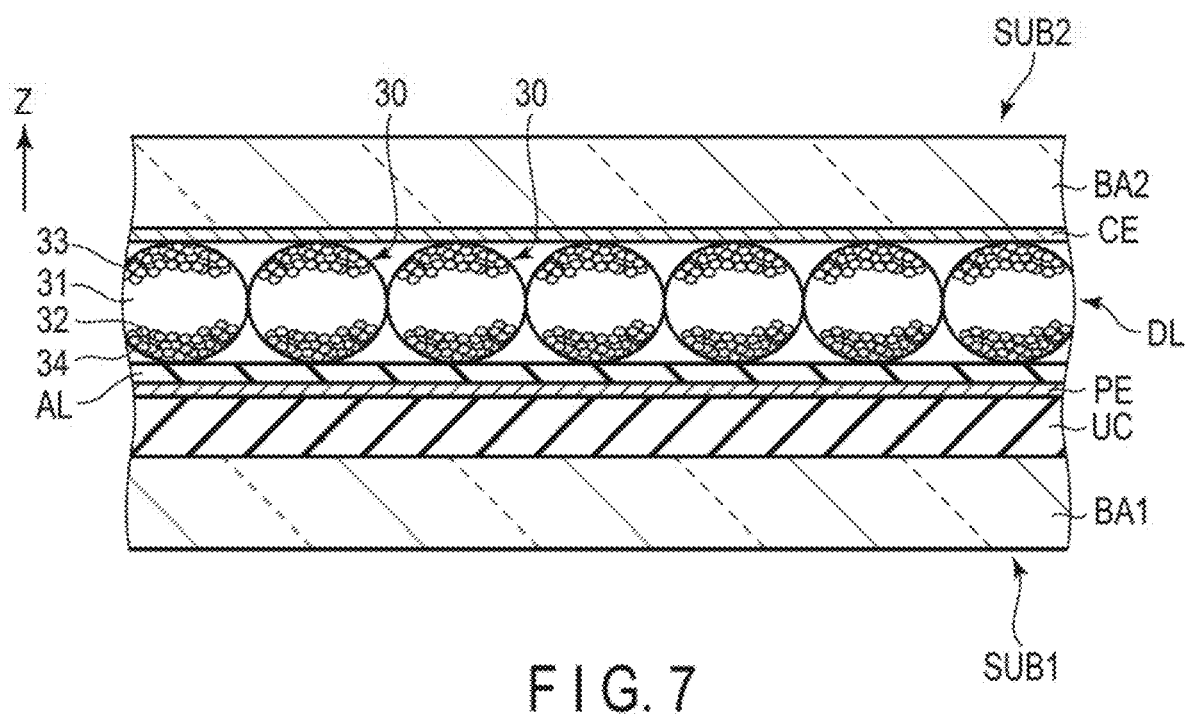
FIG. 7 is a cross-sectional view showing the display device DSP.

FIG. 7 is a cross-sectional view showing the display device DSP. The illustration here focuses on one pixel PX.

As shown in FIG. 7, the first substrate SUB1 comprises the first base BA1, the undercoat layer UC disposed on the first base BA1, and the pixel electrode PE disposed on the undercoat layer UC. A second substrate SUB2 comprises the second base BA2 opposed to the pixel electrode PE, and the common electrode CE located between the second base BA2 and the pixel electrode PE and opposed to the pixel electrode PE. The common electrode CE is formed of a transparent conductive material such as indium tin oxide (ITO) or indium zinc oxide (IZO).

In the present embodiment, the first substrate SUB1 is a semiconductor substrate, and the second substrate SUB2 is a counter-substrate. The first base BA1 and the second base BA2 are formed of an insulating material such as resin or glass. In the present embodiment, the second base BA2 is located on a screen side (observation side) and has optical transparency. Since the first base BA1 is located on an opposite side to the screen, it may be non-transparent or transparent.

A display function layer DL of the display device DSP is located between the pixel electrode PE and the common electrode CE. A voltage applied between the pixel electrode PE and the common electrode CE is applied to the display function layer DL. In the present embodiment, the display device DSP is an electrophoretic display device, and the display function layer DL is an electrophoretic layer. The display function layer DL is formed of a plurality of microcapsules 30 arrayed almost without any space in between in the XY-plane.

An adhesive layer AL of the display device DSP is located between the pixel electrode PE and the display function layer DL.

The microcapsules 30 are spheres having a particle diameter of about 20 μm to 70 μm, for example. In the illustrated example, for reasons of scale, a large number of microcapsules 30 are disposed between one pixel electrode PE and the common electrode CE. However, in the pixel PX having a rectangular shape or a polygonal shape whose sides have a length of about one to several hundred micrometers, about one to ten microcapsules 30 are disposed.

The microcapsule 30 comprises a dispersion medium 31, a plurality of black particles 32, and a plurality of white particles 33. The black particles 32 and the white particles 33 may be referred to also as electrophoretic particles. An outer shell portion (wall membrane) 34 is formed of transparent resin such as acrylic resin, for example. The dispersion medium 31 is a liquid which disperses the black particles 32 and the white particles 33 inside the microcapsule 30. The black particles 32 are, for example, particles (polymer or colloid) made of a black pigment such as aniline black and are, for example, positively charged. The white particles 33 are, for example, particles (polymer or colloid) made of a white pigment such as titanium dioxide and is, for example, negatively charged. Various additives may be added to these pigments as needed. In addition, instead of the black particles 32 and the white particles 33, for example, pigments of red, green, blue, yellow, cyan, magenta and the like may be used.

In the display function layer DL of the above-described configuration, when the pixel PX displays black, the pixel electrode PE is held at high potential relative to the common electrode CE. That is, the potential of the electrode CE is assumed to be a reference potential, the pixel electrode PE is held at positive polarity. Accordingly, while the positively charged black particles 32 are attracted to the common electrode CE, the negatively charged white particles 33 are attracted to the pixel electrode PE. As a result, black is visually recognized when this pixel PX is observed from the common electrode CE side. On the other hand, when the pixel PX displays white, the potential of the common electrode CE is assumed to be a reference potential, and the pixel electrode PE is held at negative polarity. Accordingly, while the negatively charged white particles 33 are attracted to the common electrode CE, the positively charged black particles 32 are attracted to the pixel electrode PE. As a result, white is visually recognized when this pixel PX is observed.

In the present embodiment, the pixel electrode PE is in contact with the adhesive layer AL. However, an insulating protective layer may be interposed between the pixel electrode PE and the adhesive layer AL, and the pixel electrode PE may be protected by the protective layer.

Figure 8:
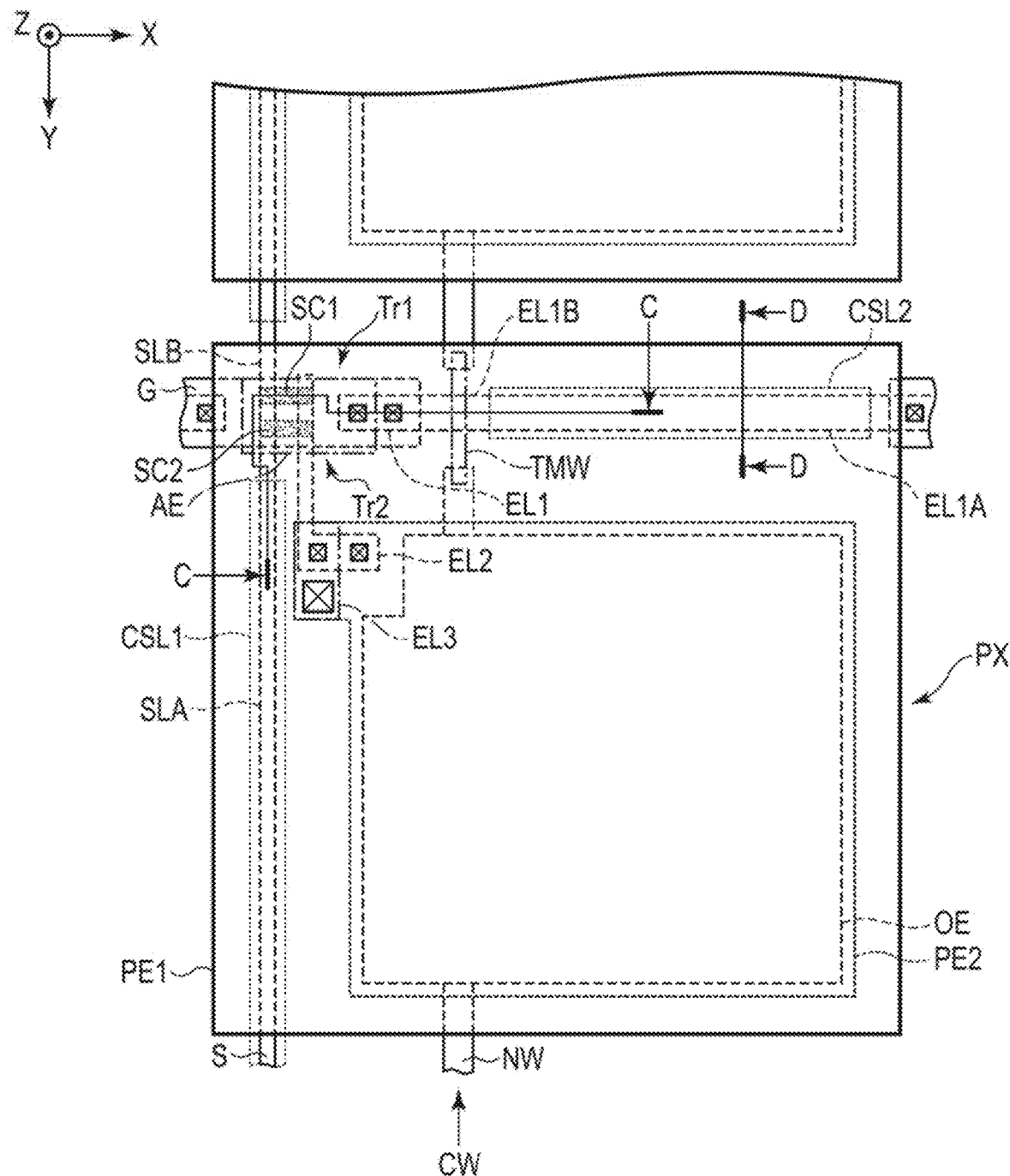
FIG. 8 is an enlarged plan view showing a part of the first substrate SUB1 of the display device DSP.

FIG. 8 is an enlarged plan view showing a part of the first substrate SUB1 of the display device DSP.

As shown in FIG. 8, the scanning line G extends in the first direction X. The signal line S extends in the second direction Y and crosses the scanning line G. The pixel electrode PE comprises a first pixel electrode PE1 and a second pixel electrode PE2 which are electrically connected to each other. The scanning line G and the signal line S cross the first pixel electrode PE1. The second pixel electrode PE2 is located spaced from the scanning line G in the second direction Y.

A first semiconductor layer SC1 of the first transistor Tr1 and a second semiconductor layer SC2 of the second transistor Tr2 entirely overlap the same scanning line G.

A first connection electrode EL1 overlaps the scanning line G and is located spaced from the signal line S in the first direction X.

A second connection electrode EL2 extends in the second direction Y. One end portion of the second connection electrode EL2 is located between the signal line S and the first connection electrode EL1 in an area overlapping the scanning line G and overlaps the respective semiconductor layers SC. The other end portion of the second connection electrode EL2 overlaps the second pixel electrode PE2.

A capacitance electrode OE is located spaced from the semiconductor layers SC, the signal line S, the first connection electrode EL1 and the second connection electrode EL2, and overlaps the first pixel electrode PE1 and the second pixel electrode PE2. In the present embodiment, the entire capacitance electrode OE is located on the inner side of the first pixel electrode PE1 and is located on the inner side of the second pixel electrode PE2 in planar view.

A connection auxiliary line TMW extends in the second direction Y and connects two connection lines NW adjacent to each other in the second direction Y across the scanning line G.

The connection lines NW extend in the second direction Y and do not cross the signal line S. The connection lines NW connect two capacitance electrodes OE which are adjacent to each other in the second direction Y across the scanning line G. The connection lines NW and the capacitance electrodes OE are integrally formed.

In the present embodiment, the connection lines NW, the connection auxiliary lines TMW and the capacitance electrodes OE arranged in the second direction Y constitute the capacitance line CW.

An auxiliary gate electrode AE overlaps the respective semiconductor layers SC and the first connection electrode EL1. In planar view, the auxiliary gate electrode AE only has to overlap at least channel areas of both of the first semiconductor layer SC1 and the second semiconductor layer SC2. In the present embodiment, the auxiliary gate electrode AE overlaps the entire first conductive layer SC1 and the entire second semiconductor layer SC2.

A third connection electrode EL3 is located spaced from the auxiliary gate electrode AE and overlaps the second connection electrode EL2 and the first pixel electrode PE1.

The scanning line G and the second pixel electrode PE2 are formed of the same material. The signal line S, the first connection electrode EL1, the second connection electrode EL2, the capacitance electrode OE and the connection line NW are formed of the same material. The connection auxiliary line TMW, the auxiliary gate electrode AE and the third connection electrode EL3 are formed of the same material. The scanning line G, the second pixel electrode PE2, the connection line NW, the auxiliary gate electrode AE and the third connection electrode EL3 are formed of a metal material such as aluminum (Al), titanium (Ti), silver (Ag), molybdenum (Mo), tungsten (W), copper (Cu) or chromium (Cr), an alloy of these metal materials combined together, or the like and may have a single-layer structure or a multilayer structure.

The signal line S is a layer stack of three layers of conductive materials similarly to the embodiment 1. That is, it is a layer stack of the first layer, the second layer and the third layer in the third direction Z. The first layer to the third layer can use any materials as long as the reflectance of the first layer and the third layer is lower than that of the second layer, and the etching rate of the first layer and the third layer is lower than that of the second layer. For example, titanium may be used as the material for the first layer and the third layer, and aluminum may be used as the material for the second material. However, as described above, the signal line S may be a layer stack of the first layer and the second layer.

The signal line S of the present embodiment is partially disposed in the concave groove portion disposed in a layer stack of insulating layers. A cross-sectional structure including the signal line S will be described below.

Figure 9:
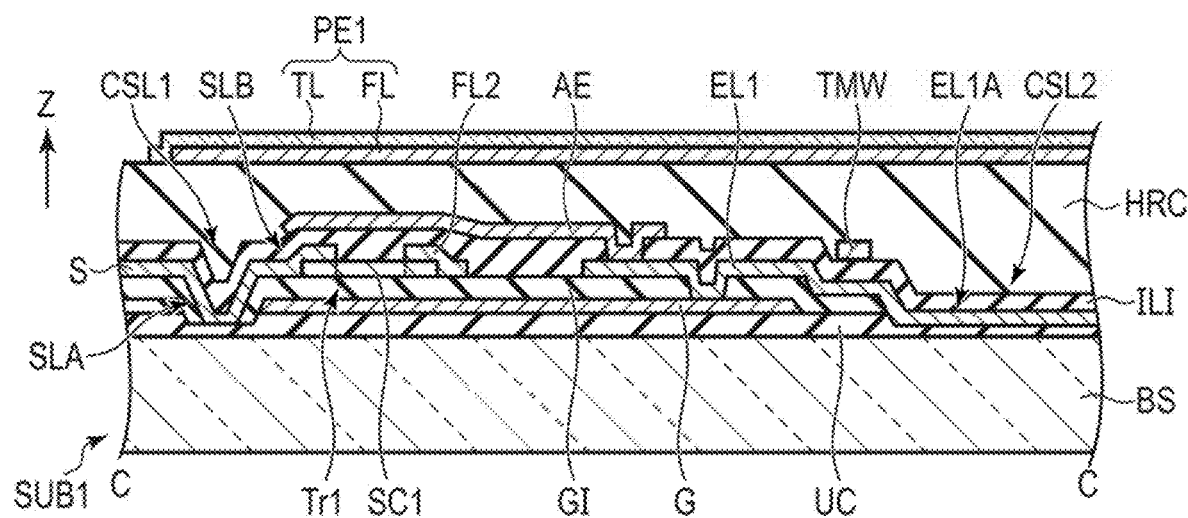
FIG. 9 is an enlarged cross-sectional view showing the first substrate SUB1 along line C-C of FIG. 8.

FIG. 9 is an enlarged cross-sectional view showing the first substrate SUB1 along line C-C of FIG. 8.

As shown in FIG. 9, the undercoat layer UC is formed on the first base BA1. The scanning line G is formed on the undercoat layer UC. The gate insulating layer GI is formed on the undercoat layer UC and the scanning line G.

The semiconductor layer SC such as the first semiconductor layer SC1 is disposed on the gate insulating layer GI. The signal line S, the first connection electrode EL1 and the second connection electrode EL2 are disposed on the gate insulating layer GI. The signal line S overlaps a part of the semiconductor layer SC such as the first semiconductor layer SC1. The second connection electrode EL2 overlaps another part of the semiconductor layer SC such as the first semiconductor layer SC1. The first connection electrode EL1 is connected to the scanning line G via a contact hole formed in the gate insulating layer GI.

The interlayer insulating layer ILI is formed on the gate insulating layer GI, the semiconductor layer SC, the signal line S, the first connection electrode EL1 and the second connection electrode EL2. The auxiliary gate electrode AE is disposed on the interlayer insulating layer ILI, and is connected to the first connection electrode EL1 via a contact hole formed in the interlayer insulating layer ILI. That is, the auxiliary gate electrode AE is electrically connected to the scanning line G via the first connection electrode EL1.

The auxiliary gate electrode AE is opposed to at least the channel area of the semiconductor layer SC. The auxiliary gate electrode AE sandwiches the first semiconductor layer SC1 and the second semiconductor layer SC2 together with the scanning line G. For example, in the first transistor Tr1, the scanning line G and the auxiliary gate electrode AE each function as a gate electrode. The first transistor Tr1 is a dual-gate thin-film transistor. A part of the scanning line G, the first semiconductor layer SC1, the auxiliary gate electrode AE and the like constitute the first transistor Tr1. The second transistor Tr2 has a cross-sectional structure similar to that of the first transistor Tr1. The scanning line G, the signal line S and the auxiliary gate electrode AE are located above the first base BA1. The first transistor Tr1 and the second transistor Tr2 are also located above the first base BA1.

The first transistor Tr1 and the second transistor Tr2 of the present embodiment are formed such that the signal line S and the second connection electrode EL2 (drain electrode) are directly superposed on the semiconductor layer SC. However, they are not limited to this. Similarly to the embodiment 1, an interlayer insulating layer may be disposed between the semiconductor layer SC and the signal line S and the second connection electrode EL2 (drain electrode).

In addition, the first transistor Tr1 and the second transistor Tr2 of the present embodiment are bottom-gate transistors. However, they are not limited to this but may be top-gate transistors.

The planarization insulating layer HRC is formed on the interlayer insulating layer ILI and the auxiliary gate electrode AE.

The materials for the undercoat layer US, the gate insulating layer GI, the interlayer insulating layer ILI and the planarization insulating layer HRC may be similar to those of the embodiment 1. For example, inorganic insulating materials are used as the undercoat layer UC, the gate insulating layer GI and the interlayer insulating layer ILI, and an organic resin material is used as the planarization insulating layer HRC.

The first pixel electrode PE1 is located above the first base BA1, the scanning line G and the signal line S. In the present embodiment, the first pixel electrode PE1 is disposed on the planarization insulating layer HRC. The first pixel electrode PE1 is composed of a layer stack of a light reflective layer FL and a transparent conductive layer TL. The light reflective layer FL is disposed on the planarization insulating layer HRC. The light reflective layer FL is formed of a metal material such as Al, Ti, Ag, Mo, W, Cu or Cr, an alloy of these metal materials combined together, or the like, and may have a single-layer structure or a multilayer structure. The light reflective layer FL of the present embodiment is a light reflective conductive layer.

The transparent conductive layer TL is disposed on the planarization insulating layer HRC and the light reflective layer FL and is in contact with the light reflective layer FL. In the present embodiment, the size of the transparent conductive layer TL is greater than the size of the light reflective layer FL, and the transparent conductive layer TL completely covers the upper surface and the side surface of the light reflective layer FL. The transparent conductive layer TL is in contact with the planarization insulating layer HRC on the outer side of the light reflective layer FL. However, the size of the light reflective layer FL and the size of the transparent conductive layer TL are not limited to the present embodiment but may be variously modified. For example, the size of the transparent conductive layer TL may be equal to the size of the light reflective layer FL, and the transparent conductive layer TL may formed completely overlapping the light reflective layer FL. In the present embodiment, the second capacitance C2 corresponds to a capacitance formed between the first pixel electrode PE1 and the common electrode CE.

The first pixel electrode PE1 may not be formed of a layer stack of the transparent conductive layer TL and the light reflective layer FL but may be formed of the light reflective layer FL or the transparent conductive layer TL.

As shown in FIGS. 8 and 9, concave groove portions CSL1 and CSL2 are formed in the undercoat layer UC and the gate insulating layer GI. The concave groove portions CSL1 and CSL2 are also formed in the undercoat layer UC but are not limited to this. The concave groove portions CSL1 and CSL2 only have to be formed in at least the gate insulating layer GI, and the concave groove portions CSL1 and CSL2 may not reach the undercoat layer UC.

When the transistors Tr1 and Tr2 of the embodiment 2 are formed similarly to the embodiment 1 such that an interlayer insulating layer is disposed between the semiconductor layer SC and the signal line S and the second connection electrode EL2 (drain electrode), the concave groove portions CSL1 and CSL2 only have to be disposed in at least the gate insulating layer GI and the interlayer insulating layer.

The signal line S comprises the first area SLA overlapping the concave groove portion CSL1 and the second area SLB not overlapping the concave groove portion CSL1. The first area SLA is located inside the concave groove portion CSL1, and the second area SLB is located on the interlayer insulating layer ILI.

The cross-sectional structure in the XZ-plane of the first area SLA is similar to that of FIG. 4. That is, the first area SLA comprises the first layer SL1, the second layer SL2 and the third layer SL3, and the side surface of the second layer SL2 is farther from the side surface of the concave groove portion CSL1 than the first portion of the first layer SL1 and the second portion of the third layer SL3. For the details of the first area SLA of the present embodiment, FIG. 4 and the description of it can be referred to, and the details will be omitted.

By disposing the first area SLA of the signal line S in the concave groove portion CSL, effects similar to those of the embodiment 1 are produced. In addition, the distance between the signal line S and the first pixel electrode PE1 in the third direction Z is increased, and the parasitic capacitance of the signal line S can be reduced.

Furthermore, the first substrate SUB1 of the present embodiment is composed such that a part of the scanning line G is replaced with the material layer of the signal line S.

As shown in FIG. 8, the first connection electrode EL1 connected to the scanning line G extends in the second direction Y and is connected to the scanning line G of the pixel adjacent in the second direction Y. The first connection electrode EL1 is formed of the same material as the signal line S as described above. A signal input to the scanning line G is transmitted to the scanning line G of the adjacent pixel via the first connection electrode EL1. Therefore, it can be said that the first connection electrode EL1 is a part of the scanning line G.

Figure 10:
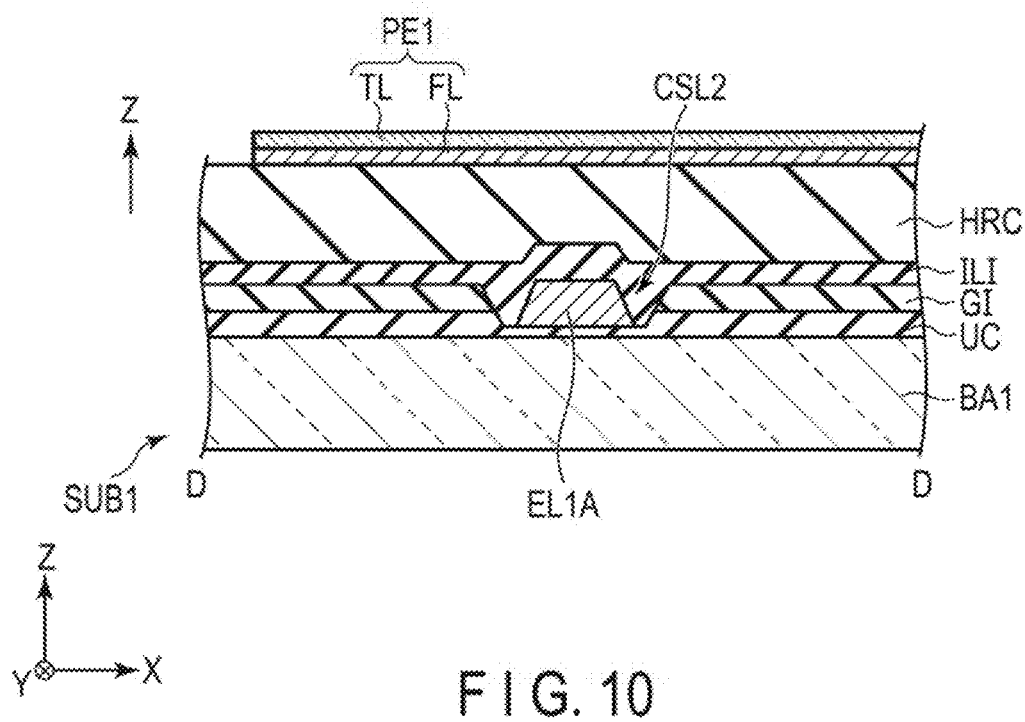
FIG. 10 is an enlarged cross-sectional view of the first substrate SUB1 along line D-D of FIG. 8.

FIG. 10 is an enlarged cross-sectional view of the first substrate SUB1 along line D-D of FIG. 8. As shown in FIG. 8, the first connection electrode EL1 comprises a first area EL1A overlapping the concave groove portion CSL2 and a second area EL1B not overlapping the concave groove portion CSL2. The concave groove portion CSL2 is disposed in the undercoat layer UC and the gate insulating layer GI as described above. The first area EL1A is disposed inside the concave groove portion CSL2, and the second area EL1B is disposed on the gate insulating layer GI.

As described above, it can be said that the first connection electrode EL1 is a part of the scanning line G. Therefore, it can be said that the first area EL1A is an area of the scanning line G which overlaps the concave groove portion CSL2.

When the material for the signal line S and the first connection electrode EL1 has a lower resistance than the material for the scanning line G, the scanning line as a whole can be made less resistive by replacing a part of the scanning line G with the first connection electrode EL1.

However, the first connection electrode EL1 is formed on the gate insulating layer GI similarly to the signal line S. The first connection electrode EL1 in the same layer as the signal line S is closer to the first pixel electrode PE1 than the scanning line G in the third direction Z. Therefore, when a part of the scanning line G is replaced with the first connection electrode EL1, the parasitic capacitance of the scanning line is increased, and a load may be applied during driving.

In the present embodiment, however, the first connection electrode EL1 is disposed inside the concave groove portion disposed in the insulating layers. Therefore, the distance between the first connection electrode EL1 and the first pixel electrode PE1 is increased, and the parasitic capacitance is reduced. Consequently, the load during driving on the scanning line is reduced.

In addition, since the first connection electrode EL1 has low resistance, the wiring line width can be reduced. As described above, the scanning line partially replaced with the low-resistance first connection electrode EL1 is reduced in wiring line width, and the parasitic capacitance can be further reduced.

An electrophoretic device is a so-called reflective display device, and does not comprise a backlight but use external light and a front light. In this case also, light entering toward the first base BA1 is reflected by the side surface SL2s of the second layer SL2, and the reflected light may degrade display quality. However, according to the present embodiment, the reflection at the side surface SL2s of the second layer SL2 can be prevented by the first portion SL1s of the first layer SL1 and the second portion SL3s of the third layer SL3, and as a result, display quality will not be degraded.

According to the present embodiment, a display device which improves a display image quality by improving a contrast can be obtained. In addition, a display device which reduces a load during driving by reducing a parasitic capacitance can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor substrate comprising:
    a first base;
    a first insulating layer disposed over the first base;
    a scanning line disposed over the first insulating layer;
    a second insulating layer disposed over the first insulating layer and the scanning line;
    a first concave groove portion disposed in at least the second insulating layer; and
    a signal line comprising a first area overlapping the first concave groove portion and a second area not overlapping the first concave groove portion, wherein
    the second area of the signal line is disposed on the second insulating layer,
    the signal line is a layer stack comprising a first layer and a second layer stacked on the first layer,
    a first end portion of the first layer of the first area projects from a side surface of the second layer in a direction parallel to a plane of the first base,
    the first layer of the first area comprises a first portion between the side surface of the second layer and the first end portion, and
    the first portion is in contact with a side surface of the first concave groove portion, and the side surface of the second layer is covered with the first portion in the first concave groove portion.

2. The semiconductor substrate according to claim 1, wherein
    the signal line is the layer stack further comprising a third layer stacked on the second layer,
    the third layer of the first area comprises a second end portion projecting from the side surface of the second layer in the direction parallel to the plane of the first base,
    the third layer of the first area comprises a second portion between the side surface of the second layer and the second end portion, and
    the first portion of the first layer and the second portion of the third layer of the first area are not parallel to each other in cross-sectional view.

3. The semiconductor substrate according to claim 2, wherein a reflectance of the first layer and the third layer is less than a reflectance of the second layer.

4. The semiconductor substrate according to claim 1, further comprising a third insulating layer between the second area of the signal line and the second insulating layer, wherein
    the first concave groove portion is disposed in the second insulating layer and the third insulating layer.

5. The semiconductor substrate according to claim 1, further comprising:
    a second concave groove portion disposed in at least the second insulating layer; and
    an area overlapping the second concave groove portion of the scanning line, wherein
    the area overlapping the second concave groove portion is in a same layer as the signal line.

6. A display device according to claim 1, further comprising:
    a second base; and
    a display function layer disposed between the first base and the second base.

7. The display device according to claim 6, wherein the display function layer is a liquid crystal layer.

8. A semiconductor substrate comprising:
    a first base;
    a first insulating layer disposed over the first base;
    a scanning line disposed over the first insulating layer;
    a second insulating layer disposed over the first insulating layer and the scanning line;
    a first concave groove portion disposed in at least the second insulating layer;
    a signal line comprising a first area overlapping the first concave groove portion and a second area not overlapping the first concave groove portion; and
    an organic insulating layer covering the signal line, wherein
    the second area of the signal line is disposed on the second insulating layer,
    the signal line is a layer stack comprising a second layer and a third layer stacked on the second layer,
    the third layer of the first area comprises a second end portion projecting from a side surface of the second layer in a direction parallel to a plane of the first base,
    the third layer of the first area comprises a second portion between the side surface of the second layer and the second end portion, and
    the organic insulating layer fills between the side surface of the second layer of the first area and a side surface of the first concave groove portion and between the first base and the second portion.

9. The semiconductor layer according to claim 8, wherein
    the signal line is the layer stack in which the second layer is stacked on a first layer,
    the second layer is disposed between the first layer and the third layer,
    the first layer of the first area comprises a first end portion projecting from the side surface of the second layer in the direction parallel to the plane of the first base,
    the first layer of the first area comprises a first portion between the side surface of the second layer and the first end portion, and
    the first portion of the first layer of the first area and the second portion of the third layer are not parallel to each other in cross-sectional view.

10. The semiconductor substrate according to claim 9, wherein
    the first portion of the first layer according to the first area is in contact with the first concave groove portion, and
    the organic insulating layer fills between the first portion and the second portion in the first concave groove portion.

11. A semiconductor substrate comprising:
    a first base;
    a first insulating layer disposed over the first base;
    a scanning line disposed over the first insulating layer;
    a second insulating layer disposed over the first insulating layer and the scanning line;
    a first concave groove portion disposed in at least the second insulating layer; and a signal line comprising a first area overlapping the first concave groove portion and a second area not overlapping the first concave groove portion, wherein the second area of the signal line is disposed on the second insulating layer, the signal line is a layer stack comprising a first layer and a second layer stacked on the first layer, a first end portion of the first layer of the first area projects from a side surface of the second layer in a direction parallel to a plane of the first base, and the first layer of the first area comprises a first portion between the side surface of the second layer and the first end portion, and the first end portion is located more inward than a side surface of the first concave groove portion.

* * * * *